United States Patent
Chen et al.

(10) Patent No.: US 7,390,734 B2
(45) Date of Patent: Jun. 24, 2008

(54) THIN FILM TRANSISTOR SUBSTRATE AND MANUFACTURING METHOD THEREOF

(75) Inventors: Hui-Chang Chen, Kaohsiung (TW); Chun-Yu Lee, Tainan County (TW); Shih-Ping Chou, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/757,454

(22) Filed: Jun. 4, 2007

(65) Prior Publication Data
US 2007/0231982 A1 Oct. 4, 2007

Related U.S. Application Data

(62) Division of application No. 10/878,084, filed on Jun. 28, 2004, now Pat. No. 7,245,012.

(30) Foreign Application Priority Data
Feb. 19, 2004 (TW) .............................. 93104158 A

(51) Int. Cl.
*H01L 21/44* (2006.01)

(52) U.S. Cl. ...................................... 438/614

(58) Field of Classification Search .................. None
See application file for complete search history.

(56) References Cited

U.S. PATENT DOCUMENTS

| | | | |
|---|---|---|---|
| 5,393,697 A | 2/1995 | Chang et al. | |
| 5,550,427 A | 8/1996 | Hayashi | |
| 5,707,902 A | 1/1998 | Chang et al. | |
| 5,977,641 A | 11/1999 | Takahashi et al. | |
| 6,091,252 A | 7/2000 | Akram et al. | |
| 6,097,459 A | 8/2000 | Shimada et al. | |
| 6,157,079 A | 12/2000 | Taguchi | |
| 6,297,519 B1 | 10/2001 | Fujikawa et al. | |
| 6,486,514 B2 | 11/2002 | Jeong et al. | |
| 6,716,660 B2 | 4/2004 | Jeong et al. | |

FOREIGN PATENT DOCUMENTS

JP 03132621 6/1991

*Primary Examiner*—Evan Pert
*Assistant Examiner*—Ben P Sandvik
(74) *Attorney, Agent, or Firm*—Thomas, Kayden, Horstemeyer & Risley

(57) ABSTRACT

A thin film transistor (TFT) substrate includes a glass substrate, a thin film transistor, an electrode pad, and a conductive bump. The TFT and the electrode pad are formed on the glass substrate, and the electrode pad is used for electrically connecting with the thin film transistor. The conductive bump includes several insulating bumps and a conductive layer. The insulating bumps are formed on the electrode pad dividedly, and the conductive layer covers the top surfaces of the insulating bumps, the inward surfaces of the insulating bumps, and the electrode pad between the insulating bumps for electrically connecting with the electrode pad. The outward side surfaces of the insulating bumps are exposed out of the conductive layer.

5 Claims, 12 Drawing Sheets

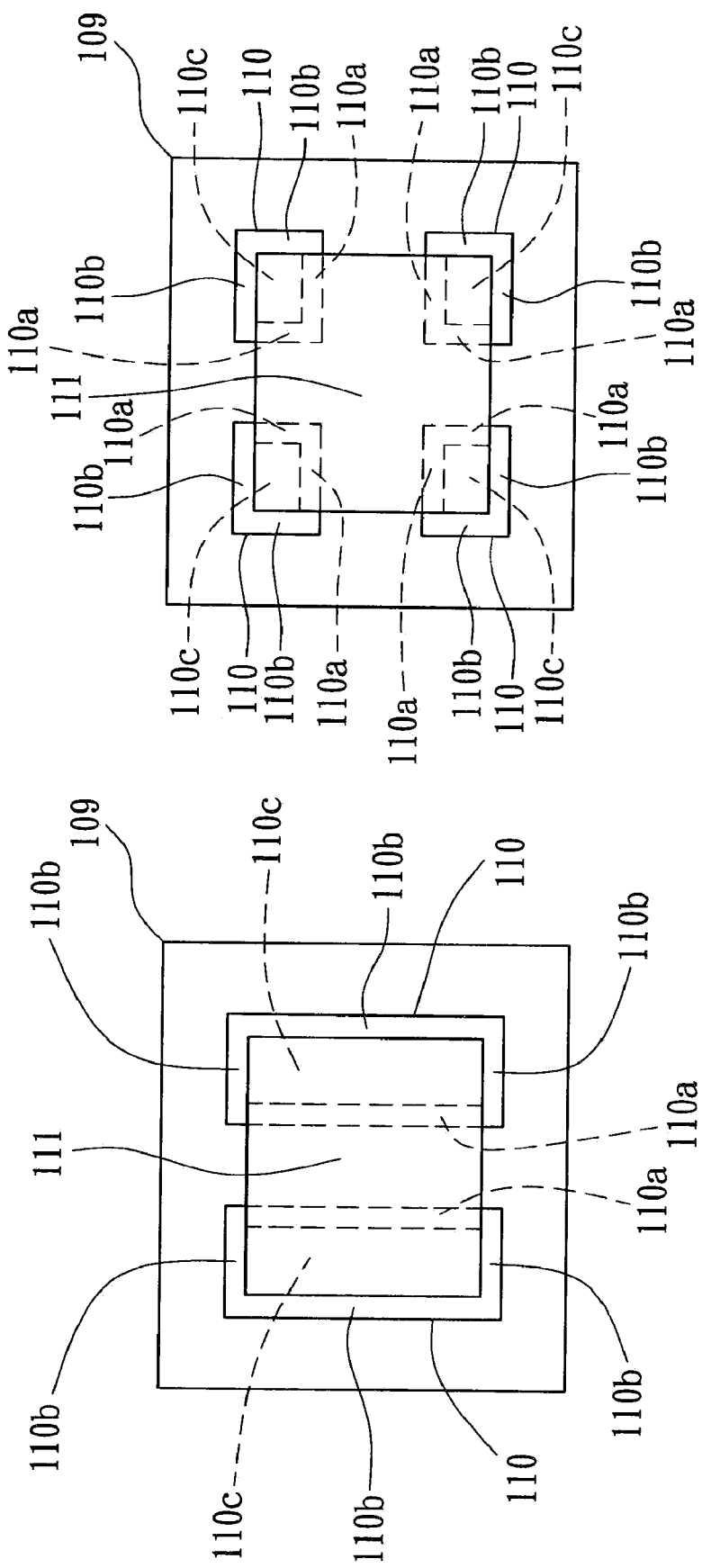

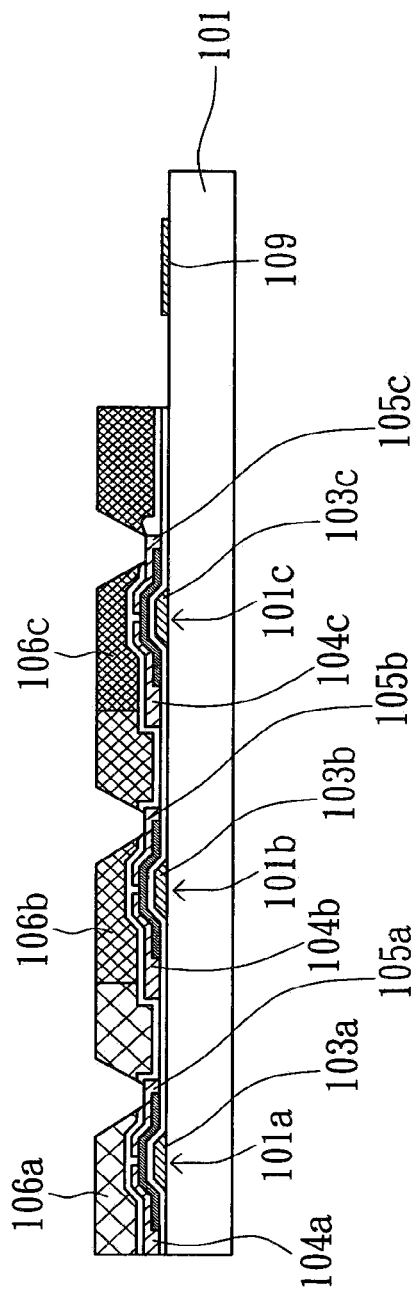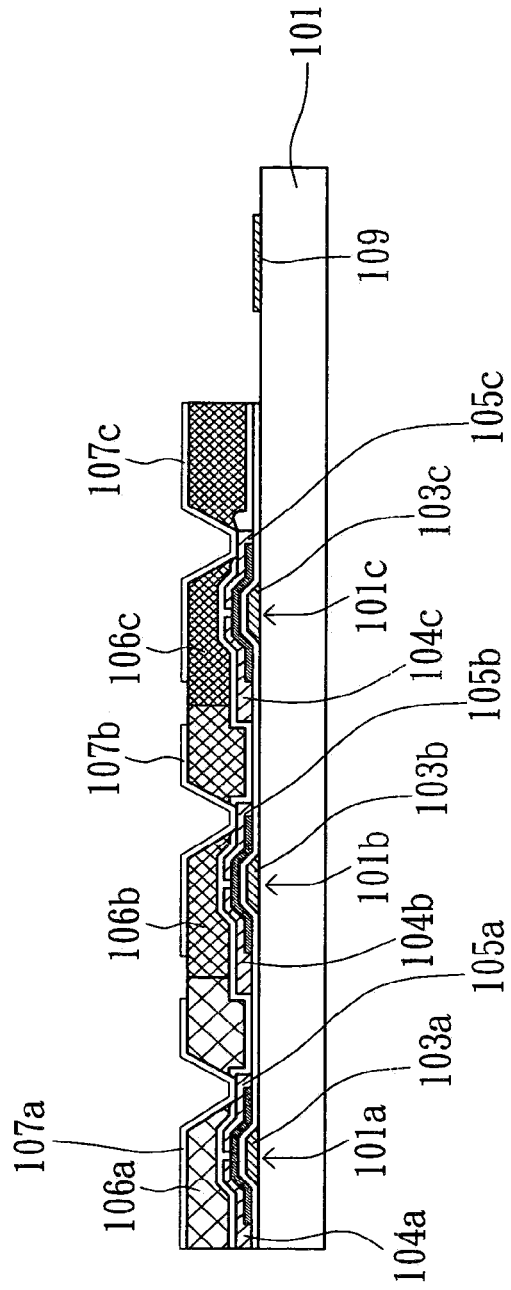

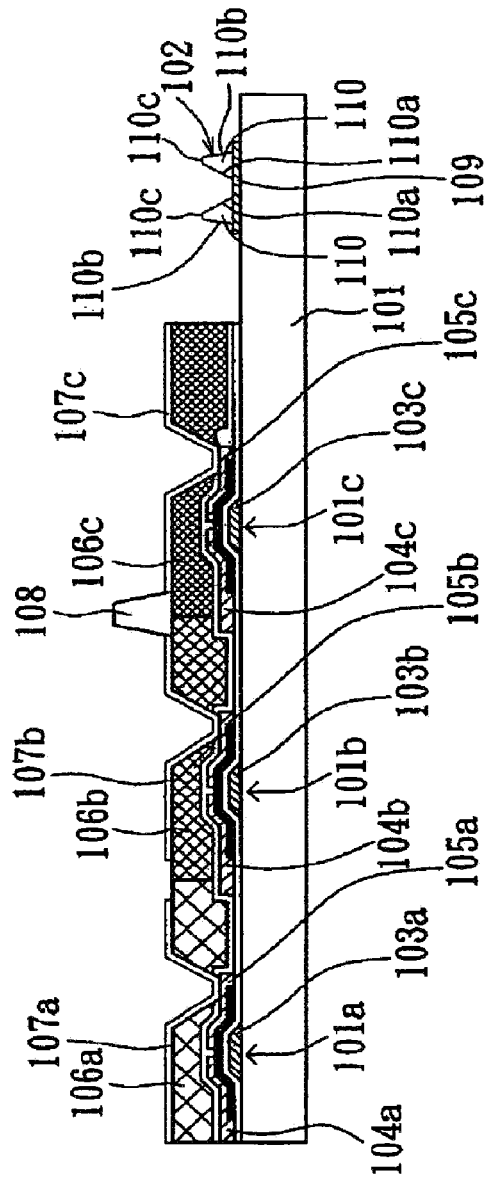
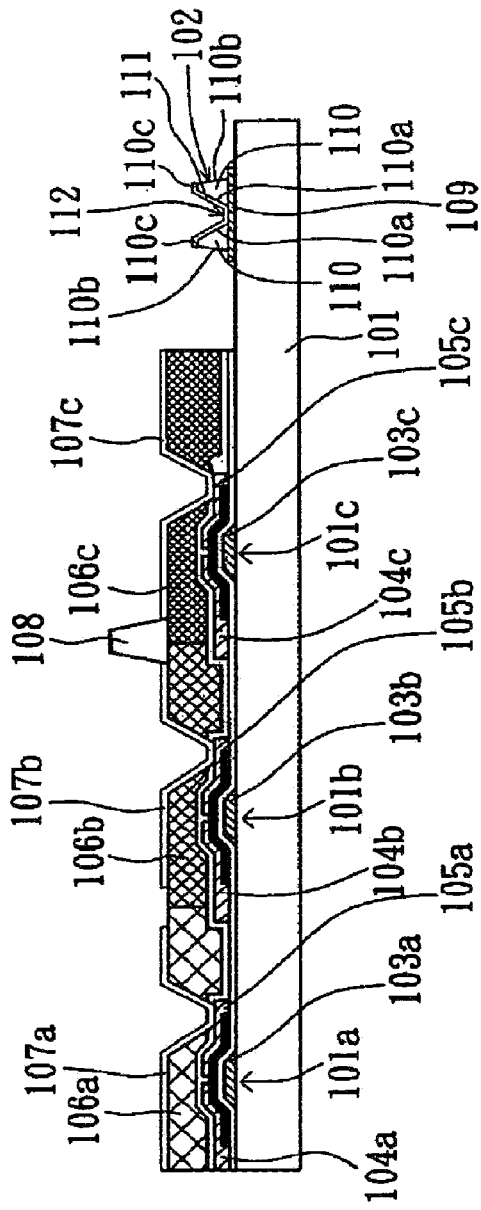

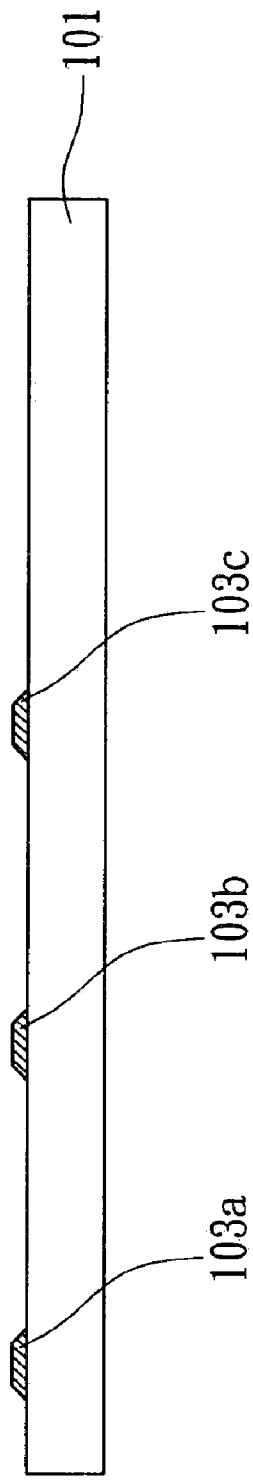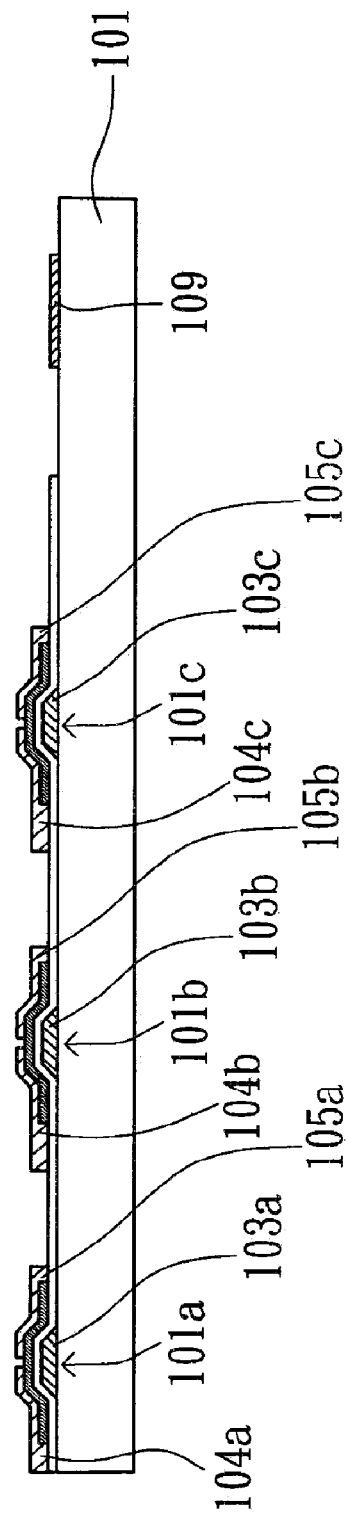
FIG. 5A
FIG. 5B

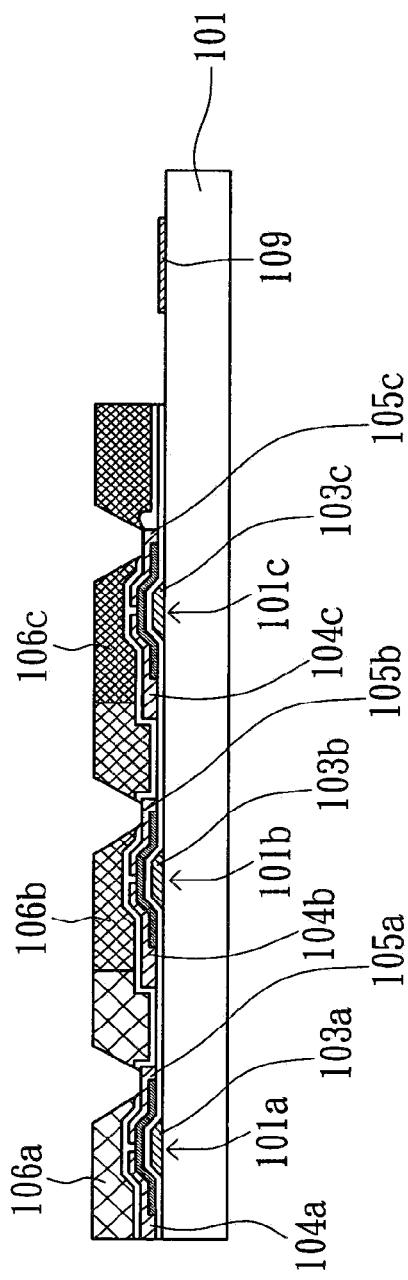
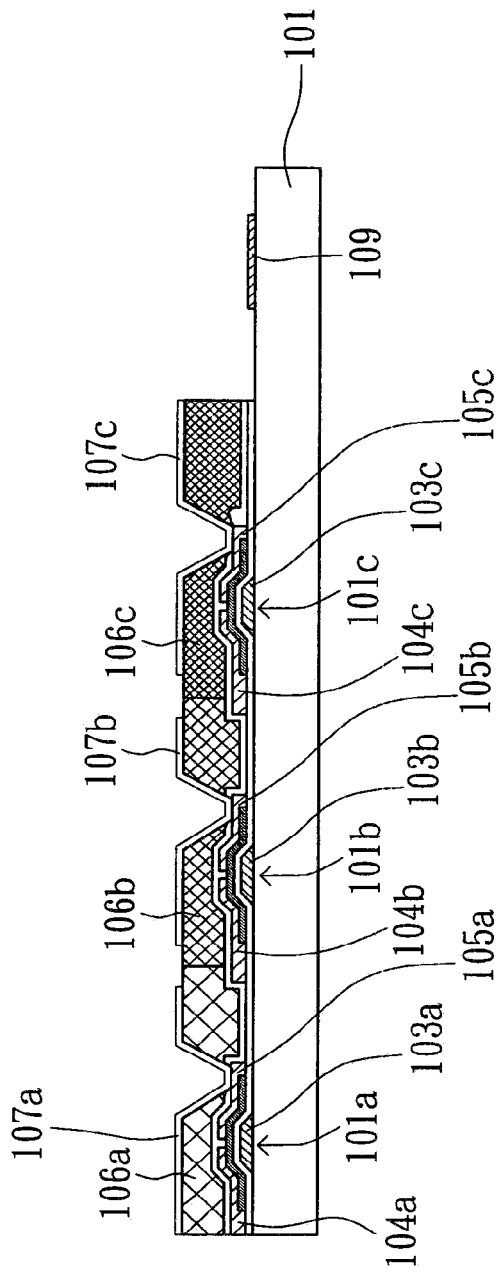
FIG. 5C
FIG. 5D

THIN FILM TRANSISTOR SUBSTRATE AND MANUFACTURING METHOD THEREOF

CROSS-REFERENCE TO RELATED APPLICATION

This application is a Divisional of U.S. patent application Ser. No. 10/878,084, filed Jun. 28, 2004 now U.S. Pat. No. 7,245,012 and entitled "Thin Film Transistor Substrate And Manufacturing Method Thereof", which is incorporated herein by reference.

This application claims the benefit of Taiwan application Serial No. 93104158, filed Feb. 19, 2004, the subject matter of which is incorporated herein by reference.

BACKGROUND OF THE INVENTION

1. Field of the Invention

The invention relates in general to a thin film transistor and manufacturing method thereof, and more particularly to a thin film transistor with conductive bumps thereon and the manufacturing method thereof.

2. Description of the Related Art

In most of the electrical devices, components can electrically connect to the main circuits by an anisotropic conductive film (ACF), for example, a driver integrated circuit is electrically connected with the display panel by an ACF. The ACF is composed of non-conductive resin and conductive particles, and the centers of the conductive particles are polymers whose surfaces are coated by a metal conductive layer, such as gold, nickel, or tin. In addition to the ACF is applied during the manufacturing processes of flat panels, chip on glass (COG) and chip on film (COF) are also applied in bonding a driver integrated circuit onto the liquid crystal display. As for COG, a driver integrated circuit (driver IC) is bonded onto the glass substrate of the display panel directly, and as for COF, the driver IC is bonded onto a carrier, such as TAB, and then the driver IC can be connected with the glass substrate by the carrier.

FIG. 1A is a cross-section view of a conventional semiconductor structure produced by COG. Referring to FIG. 1, a conventional semiconductor structure 10 includes a glass substrate 11, a chip 12, and an ACF 16. Several metal electrode pads 13 are on the surface of the substrate 11a, and several aluminum electrode pads 14 are on the surface of the chip 12a. Each one glad bump 15 is on each of the aluminum electrode pads 14. The ACF 16 is connected with part of the surface of the substrate 11a, and part of the surface of the chip 12a. The ACF 16 includes several conductive particles 17, and parts of the conductive particles 17 are for electrically connecting with the metal electrode pads 13 and the gold bumps 15.

When the pitch between two adjoining aluminum electrode pads 14 is decreasing to meet the requirement of small sizes, the pitch between two gold bumps 15 is decreasing as well. However, it is easy to cause electrical short between two adjoining gold bumps 15 when the conductive particles 17 gather together between two adjoining gold bumps 15, as shown in FIG. 1A. As a result, the electrical quality of the semiconductor structure 10 is great affected.

Referring to FIG. 1B, is a cross-section view of a composite bump formed on a chip or substrate disclosed in U.S. Pat. No. 5,393,697. In FIG. 1B, an aluminum pad 26 is formed on the surface 30a of the chip 30. A passivation layer 28 is formed on part of the surface of the chip 30a and on the surroundings of the aluminum pad 26, the central of the aluminum pad 26 is exposed. A composite bump 31 is on the chip 30, and includes a polymer body 32 and a conductive metal layer 36. The polymer body 32 is formed on the central of the aluminum pad 26. A space is between the polymer body 32 and the passivation layer 28, for exposing part of the aluminum pad 26. The conductive metal layer 36 covers the polymer body 32, part of the aluminum pad 26, and part of the passivation layer 28, for electrically connecting with to the aluminum pad 26.

When the chip 30 with several composite bumps 31 is electrically connected with several electrode pads of a glass substrate by an ACF, the conductive particles of the ACF still gather together between two adjoining composite bumps 31 easily, which causes electrical connecting and electrical short between two adjoining composite bumps 31. Moreover, the heights of the composite bumps 31 on the chip 30 are difficult to be controlled well. The composite bumps 31 on the chip 30 are uneven, so that the surface of the chip 30 cannot be electrically connected with the substrate evenly, and the electrical quality of the chip 30 and the substrate thereon are great affected.

SUMMARY OF THE INVENTION

In view of the foregoing, it is an object of the present invention to provide a thin film transistor (TFT) substrate and the manufacturing method thereof. The design that the conductive layer covers the top surfaces of the insulating bumps, the inward surfaces of the insulating bumps, and the electrode pad between the insulating bumps can prevent electrical short during electrically connecting with chip and the glass substrate with an ACF. Also, the design for manufacturing the insulating bumps during forming the photo spacers can get high quality of bumps and prevent uneven surface between the insulating bumps. Besides, the conductive bumps is formed during the TFT producing process so that it is not necessary to form the conductive bumps on chips, and the cost of materials can be saved.

The invention achieves the above-identified object by providing a thin film transistor (TFT) substrate including a glass substrate, a thin film transistor, an electrode pad, and a conductive bump. The TFT and the electrode pad are formed on the glass substrate, and the electrode pad is used for electrically connecting with the thin film transistor. The conductive bump includes several insulating bumps and a conductive layer. The insulating bumps are formed on the electrode pad dividedly, and the conductive layer covers the top surfaces of the insulating bumps, the inward surfaces of the insulating bumps, and the electrode pad between the insulating bumps for electrically connecting with the electrode pad. The outward side surfaces of the insulating bumps are exposed out of the conductive layer.

It is another object of the invention to provide a method for manufacturing a thin film transistor (TFT) substrate. At first, a glass substrate is provided. Then, a first thin film transistor, a second thin film transistor, and an electrode pad are formed on the glass substrate. The electrode pad is electrically connected with the first thin film transistor and the second thin film transistor. A first color filter and a second color filter are formed on the first thin film transistor and the second thin film transistor, respectively. Further, a first pixel electrode and a second pixel electrode are formed on part of the first color filter and the second color filter, respectively. The first pixel electrode and the second pixel electrode are electrically connected with the first thin film transistor and the second thin film transistor, respectively. The first pixel electrode are separated from the second pixel electrode so that a surface border between the first color filter and the second color filter is exposed out of the first pixel electrode and the second pixel electrode. Then, a first photo spacer and a plurality of second photo spacer are formed on the surface border between the first color filter and the second color filter and the electrode pad, respectively. The second photo spacers are deposited dividedly. Finally, a conductive layer is formed and covers the top surfaces of the second photo spacers, the inward surfaces of the second photo spacers, and the electrode pad between the second photo spacers. The conductive layer is electrically connected with the electrode pad, and the outward side surfaces of the second photo spacers are exposed out of the conductive layer.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 3A is an enlarged vertical view of the electrode pad and the conductive bump with two insulating bumps in FIG. 2.

FIG. 3B is an enlarged vertical view of the electrode pad and the conductive bump with four insulating bumps in FIG. 2.

FIGS. 4A to 4F are flow lateral views of the TFT substrate manufacturing method according to the first example of the preferred embodiment of the present invention.

FIGS. 5A to 5F are flow lateral views of the TFT substrate manufacturing method according to the second example of the preferred embodiment of the present invention.

DETAILED DESCRIPTION OF THE INVENTION

The present invention now will be described more fully hereinafter with reference to the accompanying drawings, in which preferred embodiments of the invention are shown. This invention may, however, be implemented in many different forms and should not be construed as limited to the embodiments set forth herein; rather, these embodiments are provided so that this disclosure will be thorough and complete, and will fully convey the scope of the invention to those skilled in the art. Like numbers refer to like components throughout.

Figure 1A:
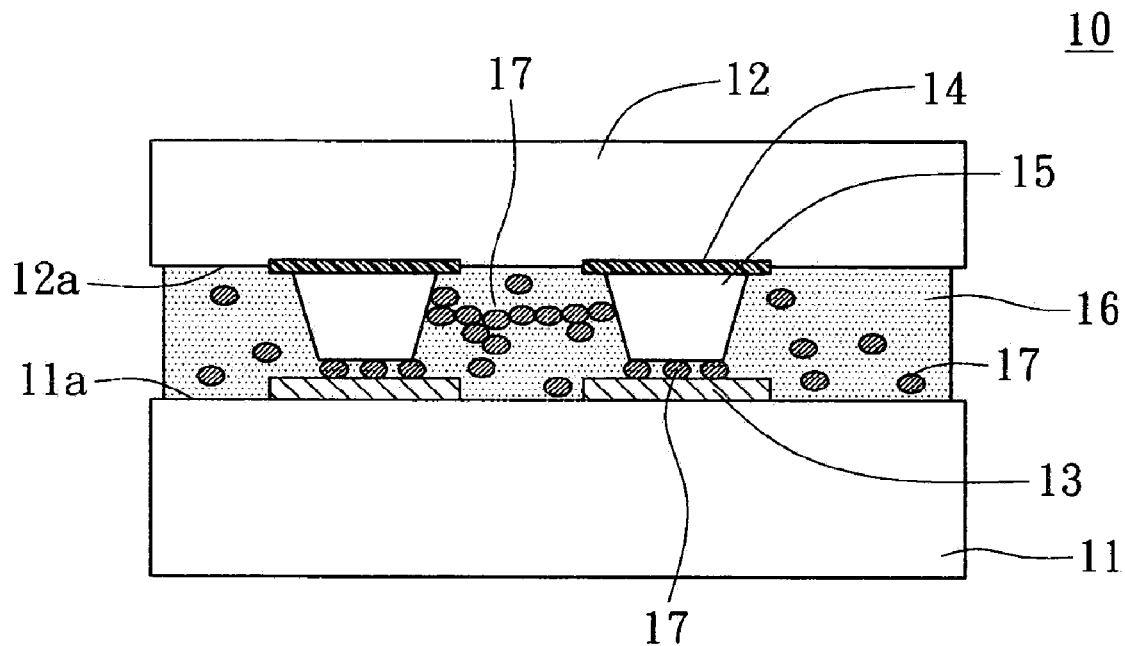
FIG. 1A (Prior Art) is a cross-section view of a conventional semiconductor structure produced by COG.
Figure 1B:
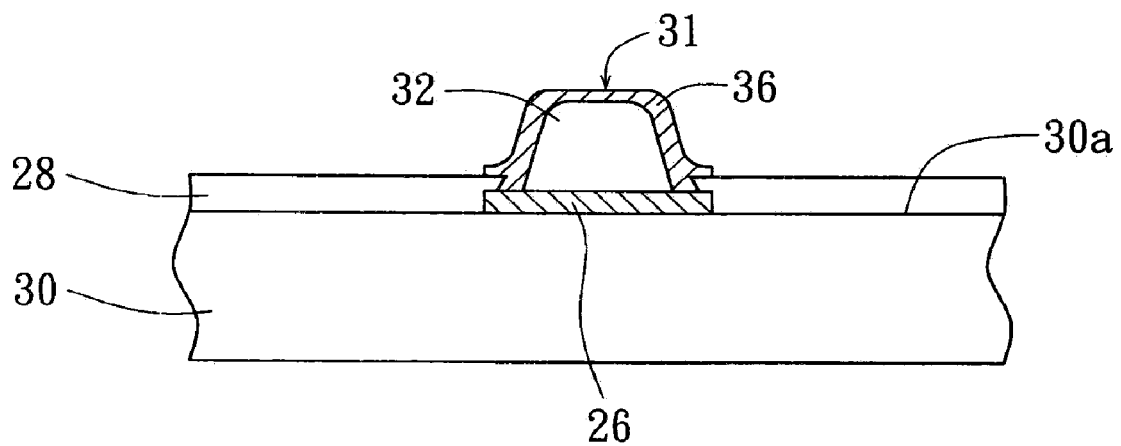
FIG. 1B (Prior Art) is a cross-section view of a composite bump formed on a chip or substrate disclosed in U.S. Pat. No. 5,393,697.
Figure 2:
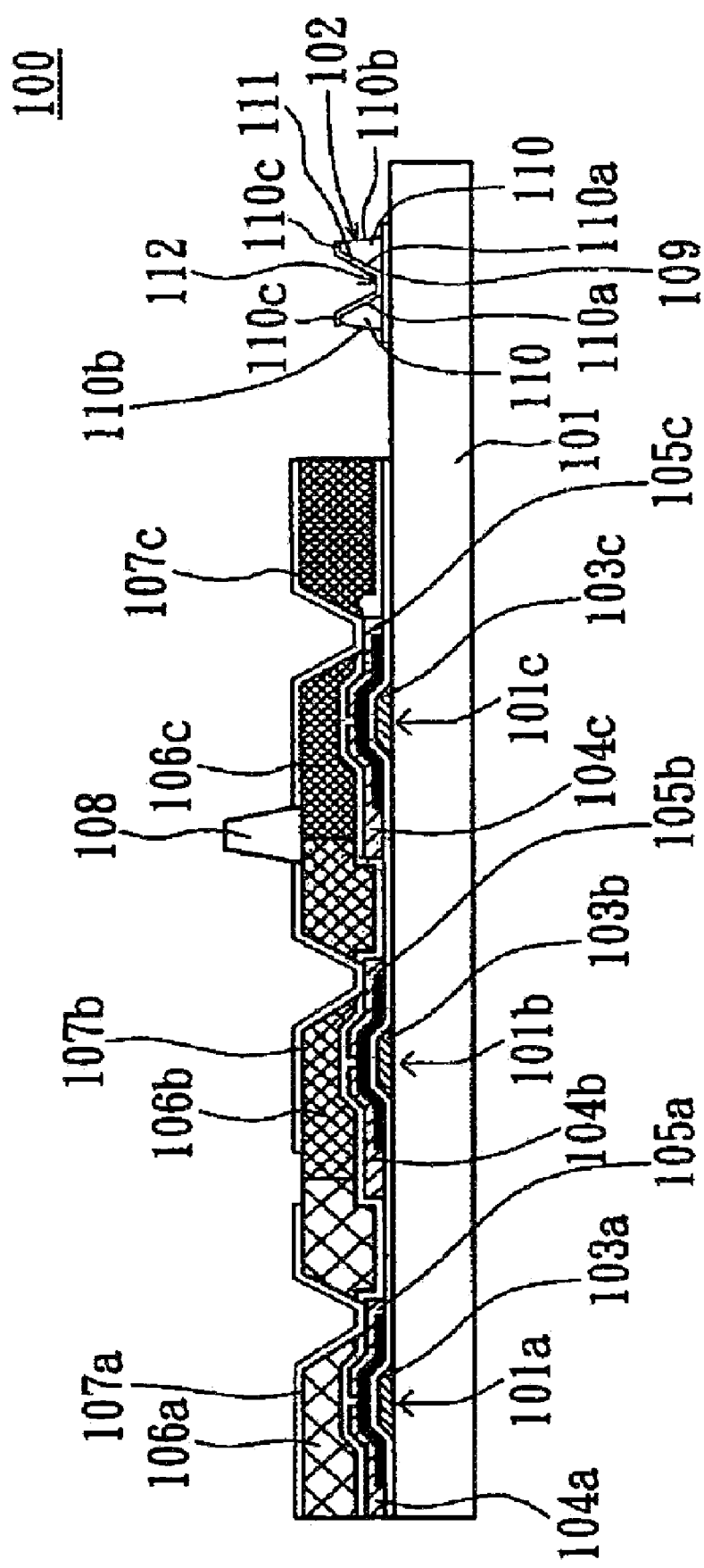
FIG. 2 is a cross-section view of a part of a semiconductor structure according to the present invention.

Referring to FIG. 2, it is a cross-section view of a part of a semiconductor structure according to the present invention. A thin film transistor (TFT) substrate 100 including a glass substrate 101, an electrode pad 109, thin film transistors 101a, 101b, and 101c, color filters 106a, 106b, and 106c, pixel electrodes 107a, 107b, and 107c, a photo spacer 108 and a conductive bump 102. The TFTs 101a, 101b, and 101c and the electrode pad 109 are formed on the glass substrate 101 dividedly, and the electrode pad 109 is electrically connects with the TFTs 101a, 101b, and 101c. The TFT 101a has a gate electrode 103a, source electrode 104a, and drain electrode 105a, the TFT 101b has a gate electrode 103b, source electrode 104b, and drain electrode 105b, and the TFT 101c has a gate electrode 103c, source electrode 104c, and drain electrode 105c. By utilizing a color filter on array (COA) process, color filters (CFs) 106a, 106b, and 106c are formed on the TFTs 101a, 101b, and 101c, respectively. The pixel electrodes 107a, 107b, and 107c are respectively formed on part of the color filters 106a, 106b, and 106c so that the surface border between the CFs 106a and 106b and the surface border between the CFs 106b and 106c are both exposed out of the pixel electrodes 107a, 107b, and 107c. Besides, the pixel electrodes 107a, 107b, and 107c are electrically connected with the TFTs 101a, 101b, and 101c, respectively, and the photo spacer 108 is formed on the surface border between the CFs 106b and 106c.

In FIG. 3A and FIG. 3B, the conductive bump 102 includes several insulating bumps 110 and a conductive layer 111. For example, two insulating bumps are shown in FIG. 3A, and four insulating bumps are shown in FIG. 3B. Referring to FIG. 3B, these four insulating bumps are respectively arranged under four corners of the conductive layer 111, preferably arranged as a matrix. The insulating bumps 110 are formed on the electrode pad 109 dividedly, and the conductive layer 111 covers the top surfaces 110c of the insulating bumps 110, the inward surfaces 110a of the insulating bumps 110, and part of the electrode pad 109 between the insulating bumps 110 for electrically connecting with the electrode pad 109. Referring to FIG. 2, it is noted that a gap 112 exists between the conductive layer 111 covering the inward surfaces 110a of the insulating bumps. Thus, when an anisotropic conductive film is interposed between the conductive bump 102 and another substrate or another chip, a plurality of conductive particles are held in the gap 112 within the conductive bump 102 so as to prevent from unexpected electrical connecting or electrical short problem between two adjacent conductive bumps. The outward side surfaces 110b of the insulating bumps 110 are exposed out of the conductive layer 111.

However, it is to be understood that the invention is not limited thereto. For example, the materials of the electrode pad 109 are metal or alloys. Besides, the electrode pad 109 includes two metal layers, which were formed on the glass substrate 101 in order. The materials of the insulating bumps 110 are the materials for photo spacers, and the conductive layer is metal or alloys. The conductive bumps of the invention can be formed on the chip or other kinds of substrates. Also, the TFTs 101a, 101b, and 101c can be three amorphous-silicon (α-Si) TFTs or three low temperature polysilicon (LTPS) TFTs or mixture of the α-Si TFT and LTPS TFT. As for the manufacturing method of thin film transistor of the present invention, three examples are provided below so that this disclosure will be thorough and complete. Like numbers refer to like components throughout.

EXAMPLE 1

Figure 4A:
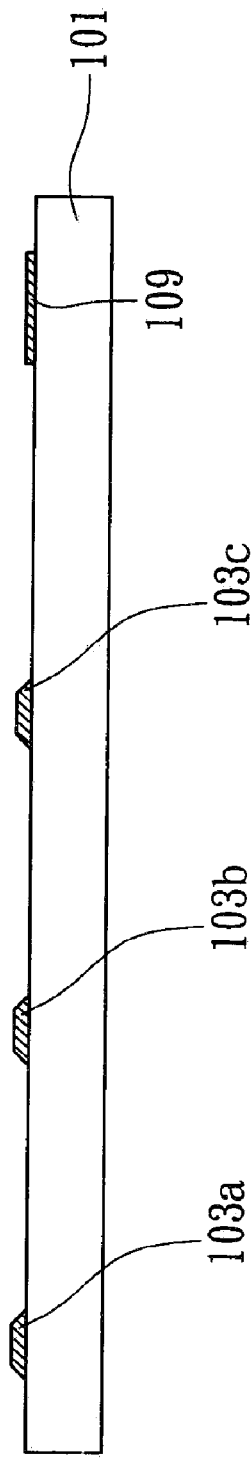
Figure 4B:
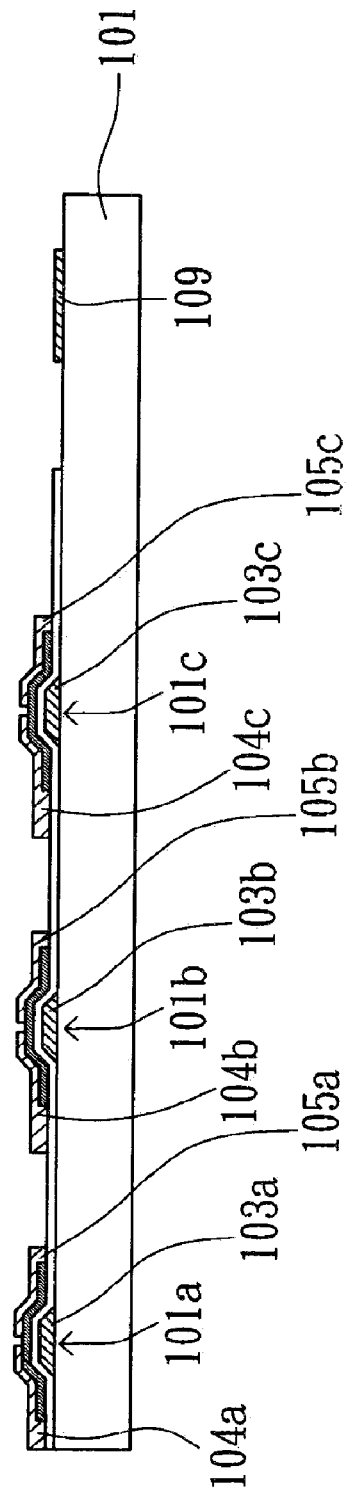

Referring to FIG. 2, FIG. 4A to FIG. 4F together, FIG. 4A to FIG. 4F are flow lateral views of the TFT substrate manufacturing method according to the first example of the preferred embodiment of the present invention. At first, in FIG. 4A, a glass substrate 101 is provided, and a first metal layer is formed on the glass substrate 101. The part of first metal layer is then removed so that the gate electrodes 103a, 103b and 103c, and the electrode pad 109 are formed on the glass substrate 101. Then, in FIG. 4B, the source electrode 104a and the drain electrode 105a are formed on the gate electrode 103a, the source electrode 104b and the drain electrode 105b are formed on the gate electrode 103b, and the source electrode 104c and the drain electrode 105c are formed on the gate electrode 103c. Therefore, the gate electrodes 103a, 103b and 103c, the source electrodes 104a, 104b and 104c, the drain electrodes 105a, 105b and 105c make up the TFTs 101a, 101b and 101c, respectively. And the electrode pad 109 is electrically connected with TFTs 101a, 101b, and 101c. Further, in FIG. 4C, the color filter 106a, 106b and 106c are formed on the TFTs 101a, 101b and 101c. In FIG. 4D, the pixel electrode 107a, 107b and 107c are formed on part of the color filters 106a, 106b and 106c and the pixel electrodes 107a, 107b and 107c are electrically connected with the TFTs 101a, 101b and 101c, respectively. The pixel electrodes 107a, 107b and 107c are separated from each other so that the surface border between the color filter 106a and the color filter 106b and the surface border between the color filter 106b and the color filter 106c are exposed out of the pixel electrodes 107a, 107b and 107c.

Then, in FIG. 4E, the photo spacer 108 and several photo spacers as insulating bumps 110 are formed on the surface border between the color filter 106b and the color filter 106c, and the electrode pad 109, respectively. The photo spacers as insulating bumps 110 are deposited dividedly. Finally, in FIG. 4F, the conductive layer 111 is formed and covers the top surfaces 110c of the insulating bumps 110, the inward surfaces 110a of the insulating bumps 110, and part of the electrode pad 109 between the divided insulating bumps 110. It is noted that a gap 112 exists between the conductive layer 111 covering the inward surfaces 110a of the insulating bumps. Thus, when an anisotropic conductive film is interposed between the conductive bump 102 and another substrate or another chip, a plurality of conductive particles are held in the gap 112 within the conductive bump 102 so as to prevent from unexpected electrical connecting or electrical short problem between two adjacent conductive bumps. The conductive layer 111 is electrically connected with the electrode pad 109, and the outward side surfaces 110b of the insulating bumps 110 are exposed out of the conductive layer 111. As a result, the conductive bump 102 is accomplished.

EXAMPLE 2

Figure 5E:
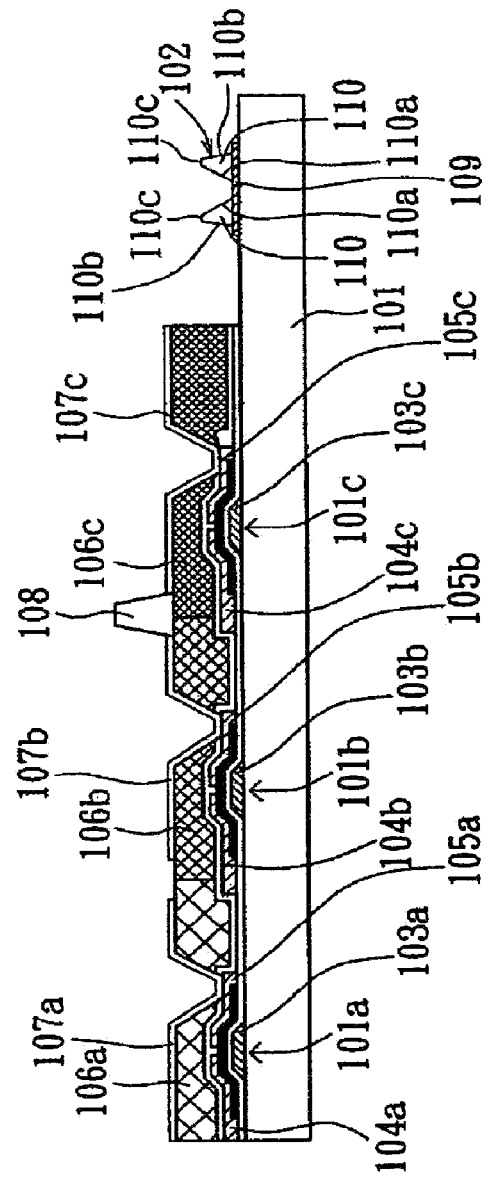
Figure 5F:
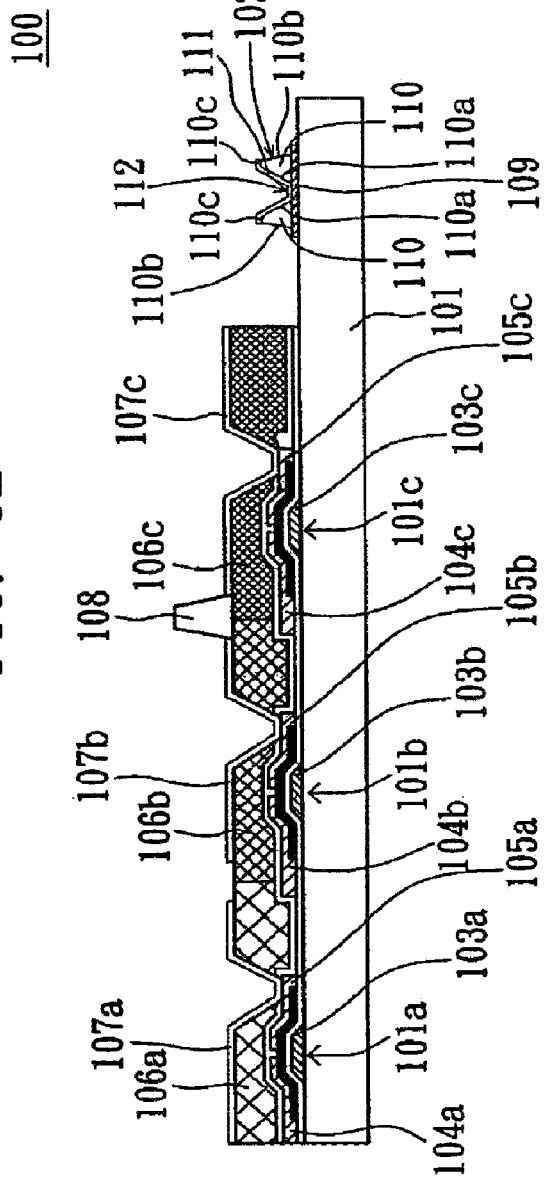

Referring to FIG. 2, FIG. 5A to FIG. 5F together, FIGS. 5A to 5F are flow lateral views of the TFT substrate manufacturing method according to the second example of the preferred embodiment of the present invention. At first, in FIG. 5A, a glass substrate 101 is provided, and a first metal layer is formed on the glass substrate 101. The part of first metal layer is then removed so that the gate electrodes 103a, 103b and 103c are formed on the glass substrate 101. Then, in FIG. 5B, a second metal layer is formed on the glass substrate 101, and the second metal layer covers the gate electrodes 103a, 103b and 103c. The part of second metal layer is removed, and the source electrodes 104a, 104b and 104c, the drain electrodes 105a, 105b and 105c, and the electrode pad 109 are formed. Besides, the source electrode 104a and the drain electrode 105a are formed on the gate electrode 103a, the source electrode 104b and the drain electrode 105b are formed on the gate electrode 103b, and the source electrode 104c and the drain electrode 105c are formed on the gate electrode 103c. Therefore, the gate electrodes 103a, 103b and 103c, the source electrodes 104a, 104b and 104c, the drain electrodes 105a, 105b and 105c make up the TFTs 101a, 101b and 101c, respectively. Further, in FIG. 5C, the color filters 106a, 106b and 106c are formed on the TFTs 101a, 101b and 101c. In FIG. 5D, the pixel electrodes 107a, 107b and 107c are formed on part of the color filters 106a, 106b and 106c and the pixel electrodes 107a, 107b and 107c are electrically connected with the TFTs 101a, 101b and 101c, respectively. The pixel electrodes 107a, 107b and 107c are separated from each other so that the surface border between the color filter 106a and the color filter 106b and the surface border between the color filter 106b and the color filter 106c are exposed out of the pixel electrodes 107a, 107b and 107c.

Then, in FIG. 5E, the photo spacer 108 and several photo spacers as insulating bumps 110 are formed on the surface border between the color filter 106b and the color filter 106c, and the electrode pad 109, respectively. The photo spacers as insulating bumps 110 are deposited dividedly. Finally, in FIG. 5F, the conductive layer 111 is formed and covers the top surfaces 110c of the insulating bumps 110, the inward surfaces 110a of the insulating bumps 110, and the electrode pad 109 between the divided insulating bumps 110. It is noted that a gap 112 exists between the conductive layer 111 covering the inward surfaces 110a of the insulating bumps. Thus, when an anisotropic conductive film is interposed between the conductive bump 102 and another substrate or another chip, a plurality of conductive particles are held in the gap 112 within the conductive bump 102 so as to prevent from unexpected electrical connecting or electrical short problem between two adjacent conductive bumps. The conductive layer 111 is electrically connected with the electrode pad 109, and the outward side surfaces 110b of the insulating bumps 110 are exposed out of the conductive layer 111. As a result, the conductive bump 102 is accomplished.

EXAMPLE 3

Figure 6A:
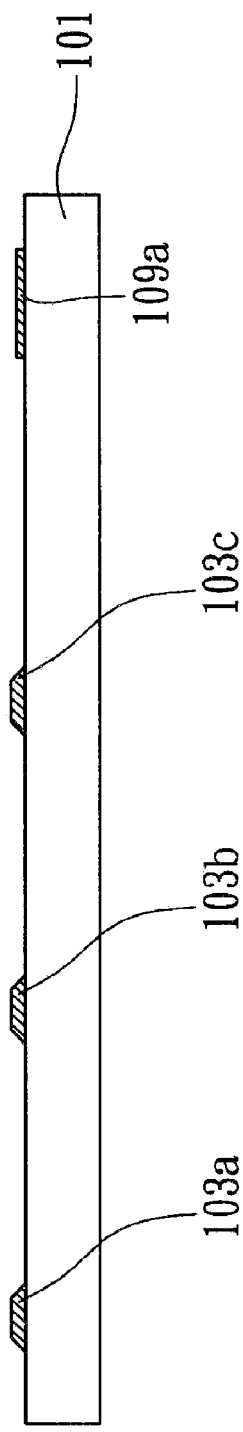
FIGS. 6A to 6F are flow lateral views of the TFT substrate manufacturing method according to the third example of the preferred embodiment of the present invention.
Figure 6B:
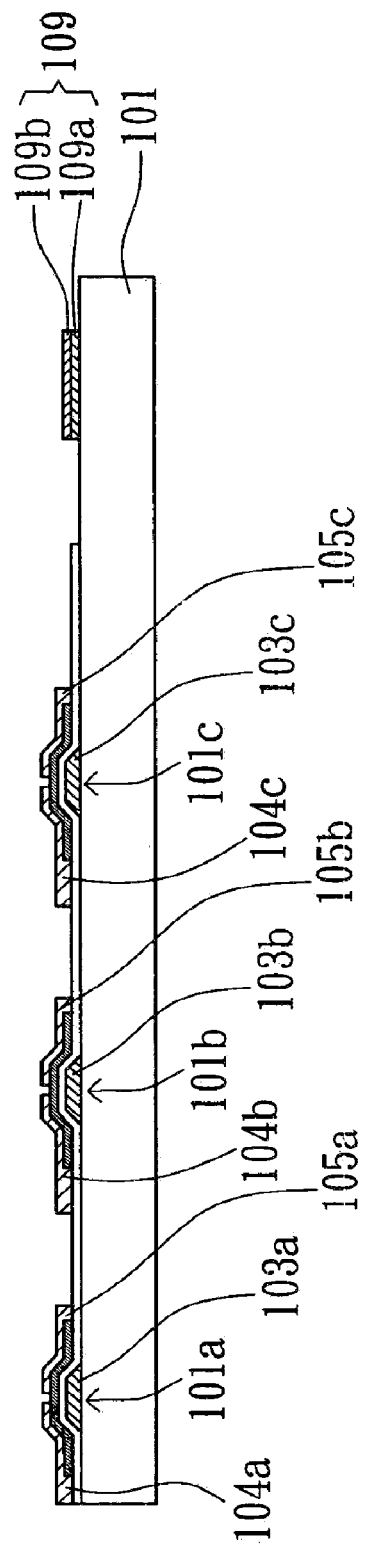
Figure 6C:
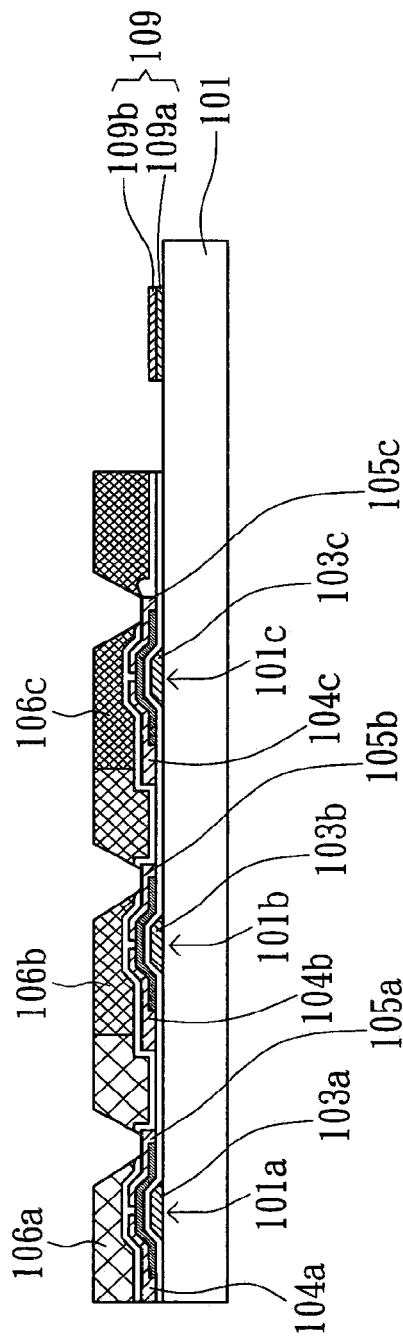
Figure 6D:
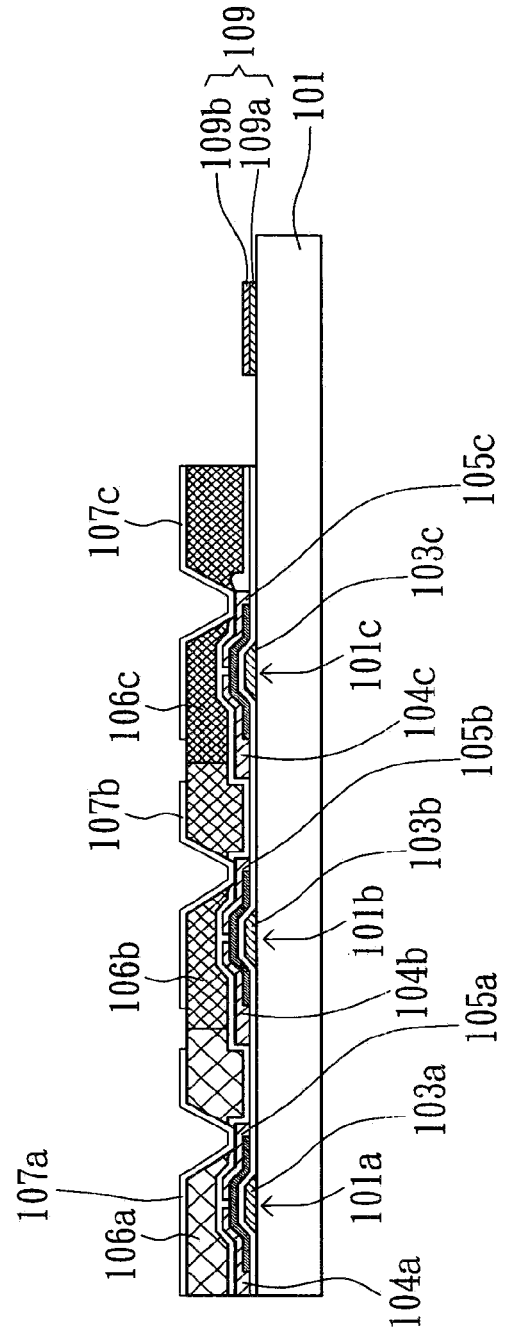

Referring to FIG. 2, FIG. 6A to FIG. 6F together, FIGS. 6A to 6F are flow lateral views of the TFT substrate manufacturing method according to the third example of the preferred embodiment of the present invention. At first, in FIG. 6A, a glass substrate 101 is provided, and a first metal layer is formed on the glass substrate 101. The part of first metal layer is then removed so that the gate electrodes 103a, 103b and 103c, and the bottom layer 109a of the electrode pad are formed on the glass substrate 101. Then, in FIG. 6B, a second metal layer is formed on the glass substrate 101, and the second metal layer covers the gate electrodes 103a, 103b and 103c, and the bottom layer 109a of the electrode pad. The part of second metal layer is removed, and the source electrodes 104a, 104b and 104c, the drain 105a, 105b and 105c, and the top layer 109b of the electrode pad are formed. Besides, the source electrode 104a and the drain electrode 105a are formed on the gate electrode 103a, the source electrode 104b and the drain electrode 105b are formed on the gate electrode 103b, and the source electrode 104c and the drain electrode 105c are formed on the gate electrode 103c. Therefore, the gate electrodes 103a, 103b and 103c, the source electrodes 104a, 104b and 104c, the drain electrodes 105a, 105b and 105c make up the TFTs 101a, 101b and 101c, respectively. The bottom layer 109a and the top layer 109b of the electrode pad make up the electrode pad 109, and the electrode pad 109 is electrically connected with the TFTs 101a, 101b, and 101c. Further, in FIG. 6C, the color filter 106a, 106b and 106c are formed on the TFTs 101a, 101b and 101c. In FIG. 6D, the pixel electrodes 107a, 107b and 107c are formed on part of the color filters 106a, 106b and 106c and the pixel electrodes 107a, 107b and 107c are electrically connected with the TFTs 101a, 101b and 101c, respectively. The pixel electrodes 107a, 107b and 107c are separated from each other so that the surface border between the color filter 106a and the color filter 106b and the surface border between the color filter 106b and the color filter 106c are exposed out of the pixel electrodes 107a, 107b and 107c.

Figure 6E:
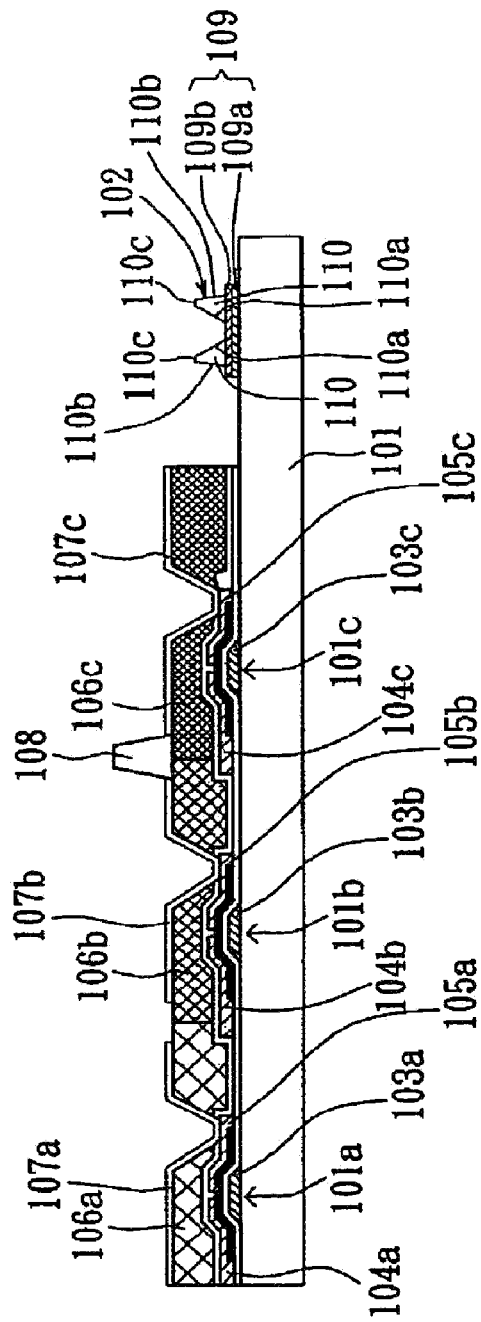
Figure 6F:
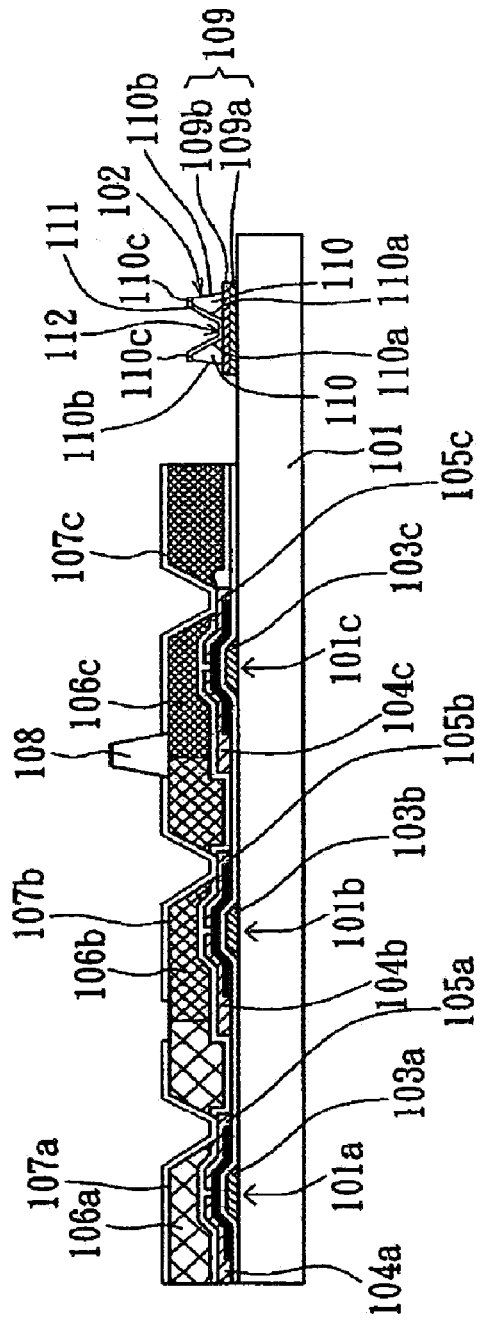

Then, in FIG. 6E, the photo spacer 108 and several photo spacers as insulating bumps 110 are formed on the surface border between the color filter 106b and the color filter 106c, and the electrode pad 109, respectively. The photo spacers as insulating bumps 110 are deposited dividedly. Finally, in FIG. 6F, the conductive layer 111 is formed and covers the top surfaces 110c of the insulating bumps 110, the inward surfaces 110a of the insulating bumps 110, and the electrode pad 109 between the divided insulating bumps 110. It is noted that a gap 112 exists between the conductive layer 111 covering the inward surfaces 110a of the insulating bumps. Thus, when an anisotropic conductive film is interposed between the conductive bump 102 and another substrate or another chip, a plurality of conductive particles are held in the gap 112 within the conductive bump 102 so as to prevent from unexpected electrical connecting or electrical short problem between two adjacent conductive bumps. The conductive layer 111 is electrically connected with the electrode pad 109, and the outward side surfaces 110b of the insulating bumps 110 are exposed out of the conductive layer 111. As a result, the conductive bump 102 is accomplished.

The thin film transistor (TFT) substrate and the manufacturing method thereof disclosed above, whose design that the conductive layer covers the top surfaces of the insulating bumps, the inward surfaces of the insulating bumps, and the electrode pad between the insulating bumps can prevent electrical short during electrically connecting with chip and the glass substrate with an ACF. Also, the design for manufacturing the insulating bumps during forming the photo spacers can get high quality of bumps and prevent uneven surface between the insulating bumps. Besides, the conductive bumps is formed during the TFT producing process so that it is not necessary to form the conductive bumps on chips, and the cost of materials can be saved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a thin film transistor (TFT) substrate, comprising:
    providing a glass substrate;
    forming a first thin film transistor, a second thin film transistor, and an electrode pad on the glass substrate, wherein the electrode pad is electrically connected with the first thin film transistor and the second thin film transistor;
    forming a first color filter and a second color filter on the first thin film transistor and the second thin film transistor respectively;
    forming a first pixel electrode and a second pixel electrode on part of the first color filter and the second color filter respectively, wherein the first pixel electrode and the second pixel electrode are electrically connected with the first thin film transistor and the second thin film transistor respectively, and the first pixel electrode is apart from the second pixel electrode so that a surface border between the first color filter and the second color filter is exposed out of the first pixel electrode and the second pixel electrode;
    forming a first photo spacer and a plurality of second photo spacers on the surface border between the first color filter and the second color filter and the electrode pad respectively, wherein the second photo spacers are deposited dividedly; and
    forming a conductive layer adapted to cover the top surfaces of the second photo spacers, the inward surfaces of the second photo spacers, and part of the electrode pad between the second photo spacers, wherein the conductive layer is electrically connected with the electrode pad, and the outward side surfaces of the second photo spacers are exposed out of the conductive layer.

2. The method of claim 1, wherein the step for manufacturing a first thin film transistor, a second thin film transistor, and an electrode pad on the glass substrate further comprises:
    forming a metal layer on the glass substrate; and
    removing part of the metal layer to form a gate electrode of the first TFT, a gate electrode of the second TFT and the electrode pad.

3. The method of claim 1, wherein the step for manufacturing a first thin film transistor, a second thin film transistor, and an electrode pad on the glass substrate further comprises:
    forming a first metal layer on the glass substrate;
    removing part of the first metal layer to form a gate electrode of the first TFT, a gate electrode of the second TFT and a bottom layer of the electrode pad;
    forming a second metal layer on the glass substrate for covering the gate electrode of the first TFT, the gate electrode of the second TFT and the bottom layer of the electrode pad; and
    removing part of the second metal layer to form a source/drain electrodes of the first TFT, a source/drain electrodes of the second TFT and a top layer of the electrode pad.

4. The method of claim 1, wherein the step for manufacturing a first thin film transistor, a second thin film transistor, and an electrode pad on the glass substrate further comprises:
    forming a first metal layer on the glass substrate;
    removing part of the first metal layer to form a gate electrode of the first TFT and a gate electrode of the second TFT forming a second metal layer on the glass substrate for covering the gate electrode of the first TFT and the gate electrode of the second TFT; and
    removing part of the second metal layer to form a source/drain electrodes of the first TFT, a source/drain electrodes of the second TFT, and the electrode pad.

5. The method of claim 1, wherein the conductive layer includes a metal or an alloy.

* * * * *